US010746761B2

(12) United States Patent
Rayman et al.

(10) Patent No.: US 10,746,761 B2
(45) Date of Patent: Aug. 18, 2020

(54) DYNAMICALLY CONFIGURABLE REMOTE INSTRUMENT INTERFACE

(71) Applicant: Keithley Instruments, Inc., Cleveland, OH (US)

(72) Inventors: Michael D. Rayman, Akron, OH (US); Gregory Sobolewski, Brecksville, OH (US)

(73) Assignee: Keithley Intstruments, LLC, Solon, OH (US)

( * ) Notice: Subject to any disclaimer, the term of this patent is extended or adjusted under 35 U.S.C. 154(b) by 0 days.

(21) Appl. No.: 15/015,893

(22) Filed: Feb. 4, 2016

(65) Prior Publication Data

US 2016/0231354 A1    Aug. 11, 2016

Related U.S. Application Data

(60) Provisional application No. 62/114,485, filed on Feb. 10, 2015.

(51) Int. Cl.
  *G01R 31/20* (2006.01)
  *G01R 1/02* (2006.01)
  (Continued)

(52) U.S. Cl.
  CPC ......... *G01R 1/025* (2013.01); *G01R 1/06727* (2013.01); *G01R 1/06788* (2013.01);
  (Continued)

(58) Field of Classification Search
  CPC .............. G01R 1/0416; G01R 1/06727; G01R 31/2868; G01R 31/2893; G01R 31/2896
  (Continued)

(56) References Cited

U.S. PATENT DOCUMENTS 6,437,552 B1  8/2002  Sekel et al.
7,925,464 B1  4/2011  Bazemore
(Continued)

FOREIGN PATENT DOCUMENTS

EP   0710910   5/1996
JP   H11201991  7/1999

OTHER PUBLICATIONS

Truchard, J.J. et al., Graphical Environment Provides Next Generation Test Solutions, Electro, Electronic Conventions Management, Jan. 1, 1987, pp. 34/401-05, vol. 12, Los Angeles, CA, US.
(Continued)

*Primary Examiner* — Raul J Rios Russo
(74) *Attorney, Agent, or Firm* — Miller Nash Graham & Dunn; Andrew J. Harrington

(57) ABSTRACT

A connection interface for connecting one or more devices under test (DUTs) to one or more remote test and measurement instruments includes a device-under-test connector for connecting a DUT to the interface, a host-instrument connector for connecting the interface to a host test and measurement instrument, and an electrical path between the device-under-test connector and the host-instrument connector. The connection interface also includes a display that has a first portion visually associated with the device-under-test connector and configured to display an identifier for a particular connection point on the DUT. In some embodiments, the first portion of the display is configured to display measurement data from the particular connection point on the DUT. In some embodiments, the display has a second portion that is configured to display information related to the host test and measurement instrument, or to display a name for a particular measurement of the DUT.

19 Claims, 4 Drawing Sheets

(51) Int. Cl.
G01R 1/067 (2006.01)
G01R 31/319 (2006.01)
G01R 31/28 (2006.01)
G01R 1/04 (2006.01)

(52) U.S. Cl.
CPC ..... G01R 31/2844 (2013.01); G01R 31/2896 (2013.01); G01R 31/31926 (2013.01); G01R 1/0416 (2013.01); G01R 31/2868 (2013.01); G01R 31/2893 (2013.01)

(58) Field of Classification Search
USPC ......... 324/71, 378, 403, 415, 425, 500, 537, 324/750.16, 750.24
See application file for complete search history.

(56) References Cited

U.S. PATENT DOCUMENTS

| | | | | |
|---|---|---|---|---|
| 2002/0060247 | A1* | 5/2002 | Krishnaswamy | A61B 5/0002 235/472.01 |
| 2002/0175689 | A1* | 11/2002 | White | G01R 31/021 324/628 |
| 2003/0035417 | A1* | 2/2003 | Zirojevic | H04L 45/00 370/357 |
| 2003/0043757 | A1* | 3/2003 | White | H04L 45/00 370/254 |
| 2004/0064288 | A1* | 4/2004 | Le | G01R 31/2808 702/158 |
| 2004/0239309 | A1 | 12/2004 | Barr et al. | |
| 2005/0088168 | A1* | 4/2005 | Reasoner | G01R 1/30 324/754.03 |
| 2005/0240373 | A1* | 10/2005 | Wubbena | H04L 43/50 702/122 |
| 2005/0256662 | A1 | 11/2005 | Alder | |
| 2005/0278129 | A1* | 12/2005 | Benvenga | G06F 11/2247 702/68 |
| 2007/0217169 | A1* | 9/2007 | Yeap | H05K 7/1461 361/752 |
| 2008/0144656 | A1* | 6/2008 | Frishberg | H04L 43/045 370/466 |
| 2008/0189060 | A1* | 8/2008 | Zellner | G01R 31/02 702/58 |
| 2011/0000677 | A1* | 1/2011 | Overfield | E21B 33/0385 166/336 |
| 2013/0106401 | A1 | 5/2013 | Johnson et al. | |
| 2014/0058697 | A1* | 2/2014 | Zaostrovnykh | G01R 27/28 702/108 |
| 2016/0018460 | A1* | 1/2016 | Gessert | G01R 31/2601 73/1.82 |
| 2016/0084902 | A1* | 3/2016 | Westbrook | G01R 31/008 702/122 |
| 2016/0202299 | A1* | 7/2016 | Zaostrovnykh | G01R 27/28 702/108 |

OTHER PUBLICATIONS

Extended European Search Report for European Patent Application No. EP16155016.5 dated Jun. 22, 2016, 10 pages.

National Intellectual Property Administration, P.R. China, First Office Action for Chinese Application 201610249974.2, Apr. 24 2019, 18 pages, Photoelectric-Technology-Invention Examination Department of Patent Examination Coordination Center, Jiangsu, China.

National Intellectual Property Administration, P.R. China, Second Office Action for Chinese Application 201610249974.2, Feb. 19, 2020, 17 pages, Photoelectric-Technology-Invention Examination Department of Patent Examination Coordination Center, Jiangsu, China.

* cited by examiner

DYNAMICALLY CONFIGURABLE REMOTE INSTRUMENT INTERFACE

CROSS-REFERENCE TO RELATED APPLICATIONS

This application claims priority from U.S. Provisional Pat. App. No. 62/114,485, filed Feb. 10, 2015, which is hereby incorporated by reference in its entirety.

TECHNICAL FIELD

This disclosure relates to test and measurement instruments, and more particularly to connection interfaces between test and measurement instruments and devices under test.

BACKGROUND

In a typical operating environment for a test and measurement instrument, the instrument is located relatively close to the user's device under test (DUT). For example, the instrument—such as one of the Keithley Model 2450 SourceMeter® Source Measure Units (SMUs) manufactured and sold by Tektronix, Inc.—may be placed on the same test bench as the user's DUT, and physically connected to the DUT by relatively short cables.

However, in other environments, a user may require the test and measurement instrument to be physically located relatively far away from the DUT. The user may require a significant distance between the instrument and the DUT because the instrument is too large, bulky, or heavy to be physically located near the DUT. Or, this requirement may arise because the operating environment of the DUT precludes placing the instrument nearby; for example, if the DUT is located in a temperature or humidity chamber, in a clean room, or in an electromagnetic interference (EMI) isolation chamber. In these environments, the instrument is typically connected to the DUT via relatively long cables.

To assist the user in making the proper cable connections between the test and measurement instrument and the DUT, the instrument typically contains static labels, often on the instrument's front panel, with names for its input connections. The instrument's labeling may also show a representation of a simplified circuit diagram so the user can understand what connections must be made between the instrument and the DUT in order to perform the user's desired measurement. For environments in which the instrument and the DUT are located in close proximity, these static labels are often sufficient for the user to properly connect a DUT and to operate the instrument. However, for environments in which the instrument and DUT are separated by a significant distance, the user may not even be able to see the instrument. Therefore, in these situations, making the proper cable connections, and troubleshooting those connections, is challenging. Furthermore, to perform some complicated measurements, cable connections may need to be changed during the measurement process, which is difficult, time-consuming, and prone to error in cases where the user does not have physical access to the test and measurement instrument.

Embodiments of the invention address these and other limitations of the prior art.

SUMMARY OF THE DISCLOSURE

A connection interface for connecting one or more devices under test (DUTs) to one or more remote test and measurement instruments includes a device-under-test connector for connecting a DUT to the interface, a host-instrument connector for connecting the interface to a host test and measurement instrument, and an electrical path between the device-under-test connector and the host-instrument connector. The connection interface also includes a display. The display has a first portion that is visually associated with the device-under-test connector. In some embodiments, the first portion of the display is visually associated with the device-under-test connector by physical proximity, or by color, or both. The first portion of the display is configured to display an identifier for a particular connection point on the device under test. In some embodiments, the first portion of the display is configured to display measurement data from the particular connection point on the DUT.

In some embodiments, the display includes a second portion that is configured to display information related to the host instrument, such as an identifier for the host instrument, a particular connection point on the host instrument, or information about the status of the host instrument. In other embodiments, the display includes a second portion that is configured to display a name for a particular measurement of the device under test.

In some embodiments, the connection interface also includes a control and a control circuit. The control is able to be actuated by a user. The control circuit takes the control as an input and is structured to communicate with the host instrument and to modify the information displayed on the display. In some embodiments, the control circuit modifies the information displayed on the display in response to the user actuating the control. In other embodiments, the control circuit modifies the information displayed on the display in response to a request from the host instrument.

A test and measurement system includes at least one test and measurement instrument and a connection interface between the test and measurement instrument and at least one device under test. The connection interface is disposed in a separate housing from the instrument. The connection interface includes a plurality of instrument connectors that are connected by a respective plurality of cables to a respective plurality of connectors on the instrument, as well as a plurality of device-under-test connectors that are structured to be connectable by a respective plurality of cables to the at least one device under test. The connection interface also includes a signal routing circuit providing a set of configurable electrical paths between the plurality of instrument connectors and the plurality of device-under-test connectors. And, the connection interface includes a display. The display has a plurality of regions. Each region of the display is visually associated with one of the plurality of device-under-test connectors and is configured to display information related to the respective device under test.

A method of instructing a test and measurement instrument user to make a connection between a particular connector on a test and measurement instrument and a particular point on a device under test includes displaying a name for the particular point on the device under test on a first portion of a display. The first portion of the display is visually associated with a first connector on a connection interface between the test and measurement instrument and the device under test. The method also includes displaying a name for the particular connector on the test and measurement instrument on a second portion of the display. The second portion of the display is visually associated with a second connector on the connection interface between the test and measurement instrument and the device under test.

DETAILED DESCRIPTION

Figure 1:
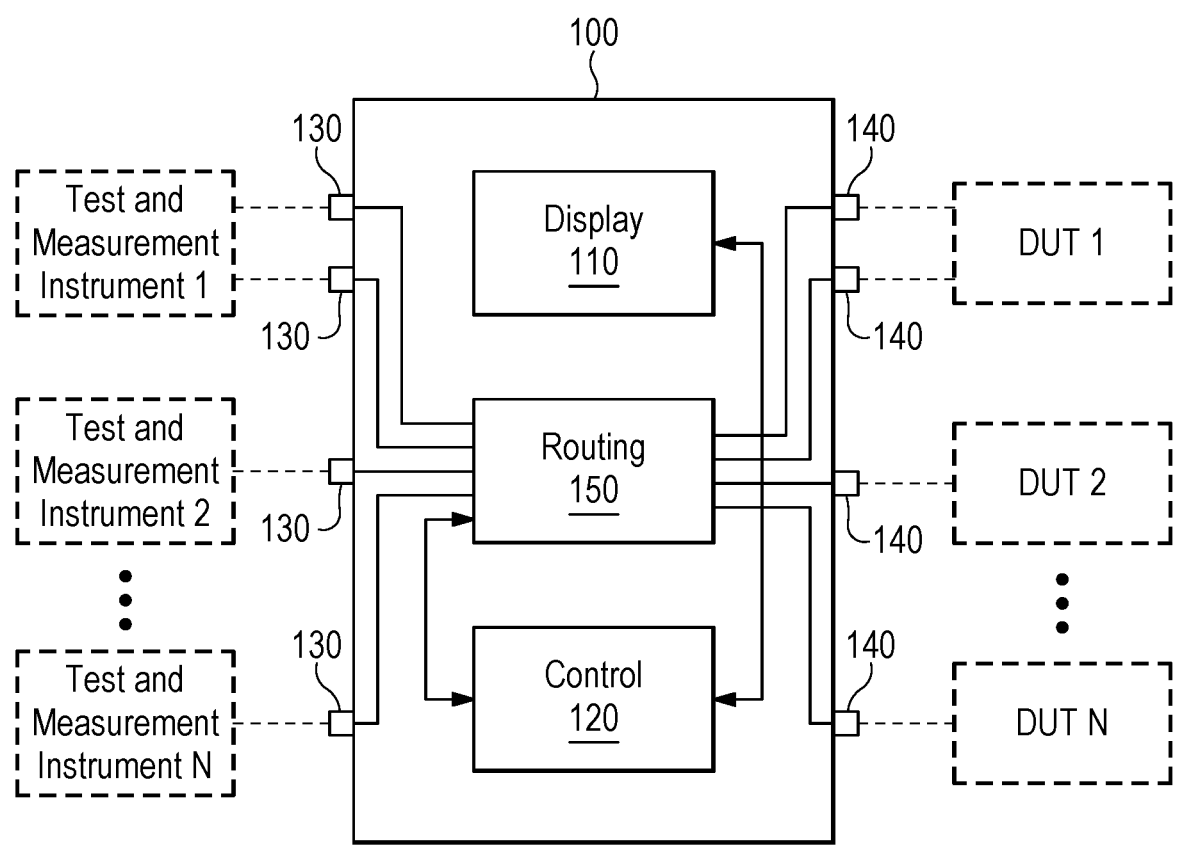
FIG. 1 is a block diagram of a connection interface according to embodiments of the invention.

FIG. 1 shows a block diagram of a dynamically configurable remote instrument connection interface 100 according to embodiments of the invention. The connection interface 100 is an interface between at least one host test and measurement instrument and at least one device under test (DUT). The connection interface 100 includes at least one host-instrument connector 130. The host-instrument connector 130 is structured to connect to the host test and measurement instrument. The connection interface 100 also includes at least one device-under-test connector 140. The DUT connector 140 is structured to connect to the DUT. The connection interface 100 also includes an electrical path between the host-instrument connector 130 and the device-under-test connector 140. The electrical path is shown in FIG. 1 as the signal path from connector 130 to a signal routing circuit 150, and from the signal routing circuit 150 to the connector 140.

The connectors 130, 140 may be, for example, banana jacks, coaxial BNCs, triaxial connectors, N-connectors, or other types of connectors suitable for the kinds of signals passing between the test and measurement instruments, the connection interface 100, and the DUTs. These signals may be signals measured from the DUTs, stimulus signals from the host instrument, or they may be control or communication signals. In the case of control or communication signals, the connectors may be a serial data type of connector, such as a Universal Serial Bus (USB) connector, or a parallel data type of connector, such as a General Purpose Interface Bus (GPM) connector.

Each connector 130, 140 may be a different type of connector. The connections between the connection interface 100 and the test and measurement instruments, and between the connection interface 100 and the DUTs will generally be made by a user using cables. The cables connecting to the test and measurement instruments are typically much longer than the cables connecting to the DUTs. For example, the cables between the connection interface 100 and the DUTs are typically 1 meter or less in length, while the cables between the connection interface 100 and the test and measurement instrument may be more than 1 meter in length.

The connection interface 100 also includes a display 110. The display 110 may be, for example, a simple monochromatic seven-segment liquid crystal display (LCD), or may be a more complex color graphical display. The display 110 may also comprise multiple display devices.

The display 110 has a first region that is visually associated with the device-under-test connector 140. That is, by looking at the first region of the display 110, a user is able to readily discern that the information displayed in the first region of the display is related to the device-under-test connector 140. In some embodiments, the first region of the display 110 is visually associated with the device-under-test connector 140 by physical proximity. That is, the display 110 is disposed on the connection interface 100 in such a way that the first region of the display 110 is located substantially near to, or substantially visually aligned with the DUT connector 140 thereby allowing a user to visually discern that information displayed on that region of the display 110 is related to the aligned DUT connector 140. In other embodiments, the first region of the display is visually associated with the DUT connector 140 by color. That is, the DUT connector 140 may be labeled with a particular color, and the first region of the display 110 may display the same particular color, for example, as a background or border, thereby allowing a user to visually discern that the first region of the display 110 is associated with the DUT connector 140. Embodiments include many other techniques for creating a visual association between the first region of the display 110 and the DUT connector 140, for example, matching patterns or symbols, or matching icons shown on or near the connector 140 as well as being displayed on the first region of the display. Embodiments can use multiple techniques for creating the visual association.

The first region of the display 110 is configured to display an identifier for a particular connection point on the DUT. As used in this disclosure, an "identifier" includes an alphanumeric name, a symbol, an icon, or other device that a user would recognize as identifying the particular connection point on the DUT. Depending on the specific DUT, the particular connection point can be an input connector, an output connector, a terminal, a contact, a test point, a via, a pin, or other possible connection points. Often, the particular connection point is an output connector on the DUT, in which case, the first region of the display 110 is configured to display the name of the output connector, for example "SIG OUT." Displaying an identifier for a particular DUT connection point on the first region of the display 110 indicates to a user that she is intended to make a connection between that particular DUT connection point and the DUT connector 140 to which the first region of the display 110 is visually associated.

Once the user makes a connection between the connection interface 100 and the DUT, according to some embodiments, the first region of the display 110 is also configured to display measurement data from the particular connection point on the DUT. For example, if the first region of the display 110 is configured to display "SIG OUT," when the user makes a connection to the DUT's "SIG OUT" connector, the first region of the display 110 is configured to display measurements of the "SIG OUT" signal, for example a display of the "SIG OUT" voltage level. The measurement data displayed in the first region of the display 110 can be real-time or historical, and can be displayed in a simple numeric format, or in a graphical format. The measurement data can also be reduced to summary status information, for example, an indication of whether any signal from the DUT is detected at all on the DUT connector 140 that is visually associated with the first region of the display 110.

According to some embodiments, the display 110 of the connection interface 100 includes a second region that is configured to display information related to the host test and measurement instrument.

In some embodiments, the second region of the display 110 is configured to display an identifier for the host instrument. For example, the second region of the display 110 can be configured to show "SCOPE 1" that the user would recognize as identifying an oscilloscope as the host instrument. Alternatively, a suitable symbol or icon can be displayed that the user would recognize as identifying the host instrument.

In some embodiments, the second region of the display 110 is configured to display an identifier for a particular connection point on the host instrument, such as an input connector, an output connector, a serial data connector, or a parallel data connector. For example, the second region of the display can be configured to show "SCOPE CH1" to indicate the particular connection point of the Channel 1 input connector on the host instrument. In some embodiments, the second region of the display 110 is visually associated with the host-instrument connector 130, similar to how the first region of the display 110 is visually associated with the DUT connector 140. In this way, a user would recognize that she is intended to make a connection between the particular connection point on the host instrument and the host-instrument connector 130 that is visually associated with the second region of the display 110. In some embodiments, the second region of the display 110 is configured to display status information for the host instrument. Status information may include, for example, whether the host instrument is triggered, whether it is acquiring a signal, whether it has encountered an error or out-of-bounds condition, etc.

In some cases, the connection interface 100 is used in an environment where the host instrument is performing a series of tests or measurements on the device under test. According to some embodiments, the display 110 of the connection interface 100 includes a second region that is configured to display a name for a particular measurement of the device under test. In these embodiments, a user can see on the second region of the display 110 what particular measurement is being performed in order to determine how far the host instrument has progressed in the test sequence.

Some embodiments of the connection interface 100 also include a control and a control circuit 120. The control is structured to be actuated by a user and can be implemented in various forms. For example, the control may be a switch, a button, a knob, a slider, a touchscreen overlaid onto the display 110, or another type of control. The control circuit 120 has the control as an input and is structured to communicate with the host instrument. The control circuit 120 may also be capable of controlling the state or behavior of the host instrument. For instance, in some embodiments, in response to the user actuating the control, the control circuit 120 communicates to the host instrument a request to initiate a particular measurement of the DUT. For example, during a sequence of tests, the user may need to change the cable connections between the connection interface 100 and the DUT. The user may push a button on the connection interface 100 to indicate that she has made appropriate inter-device cable connection changes. Pushing the button would then cause the control circuit 120 to communicate a request to the host instrument to proceed to the next test in the sequence.

The control circuit 120 is also structured to modify the information displayed on the display 110. The control circuit 120 modifies the information displayed on the display 110 in response to the user actuating the control, or in response to a request from the host instrument. For example, the user may push a button to cycle through a series of measurement data from the DUT connector 140. Or, for example, the host instrument may send a request to the connection interface 100 to cause the control circuit 120 to change the identifier displayed for a particular connection point on the DUT.

According to some embodiments, the connection interface 100 also includes a signal routing circuit 150. The signal routing circuit 150 may be implemented simply as a pass-through connection from a single host-instrument connector 130 to a single DUT connector 140. Alternatively, the signal routing circuit 150 may connect a plurality of host-instrument connectors 130 to a plurality of DUT connectors 140. In some embodiments, the signal routing circuit 150 includes switching circuitry to dynamically change the configuration of the electrical paths between the plurality of connectors 130, 140. The plurality of electrical paths may be configured in response to a request from the host instrument. Also, the signal routing circuit 150 may include amplification circuitry, or other signal conditioning circuitry.

A test and measurement system, according to embodiments of the invention, includes a test and measurement instrument, and a connection interface 100, embodiments of which are described above. The connection interface is disposed in a separate housing from the instrument, but is connected by a cable between the host-instrument connector 130 and a connector on the instrument. As explained above, the connected test and measurement instrument communicates with the connection interface 100 to control the information displayed on the display 110 of the connection interface 100. For example, the instrument may change the identifier for a particular connection point on the DUT displayed on the first region of the display 110. In some embodiments, the test and measurement system includes a plurality of test and measurement instruments, and the connection interface 100 includes a plurality of instrument connectors 130 and DUT connectors 140.

The visual association between a region of the display 110 of the connection interface 100 and one of the connectors 130, 140 is highly beneficial for aiding a user in making the appropriate inter-device connections. Thus, a method of instructing a test and measurement instrument user to make a connection between a particular connector on a test and measurement instrument and a particular point on a device under test, according to embodiments of the invention, includes: displaying, on a first region of the display 110 that is visually associated with a DUT connector 140, an identifier for the particular point on the device under test; and, displaying, on a second region of the display 110 that is visually associated with a host-instrument connector 130, an identifier for the particular connector on the host instrument.

Figure 2:
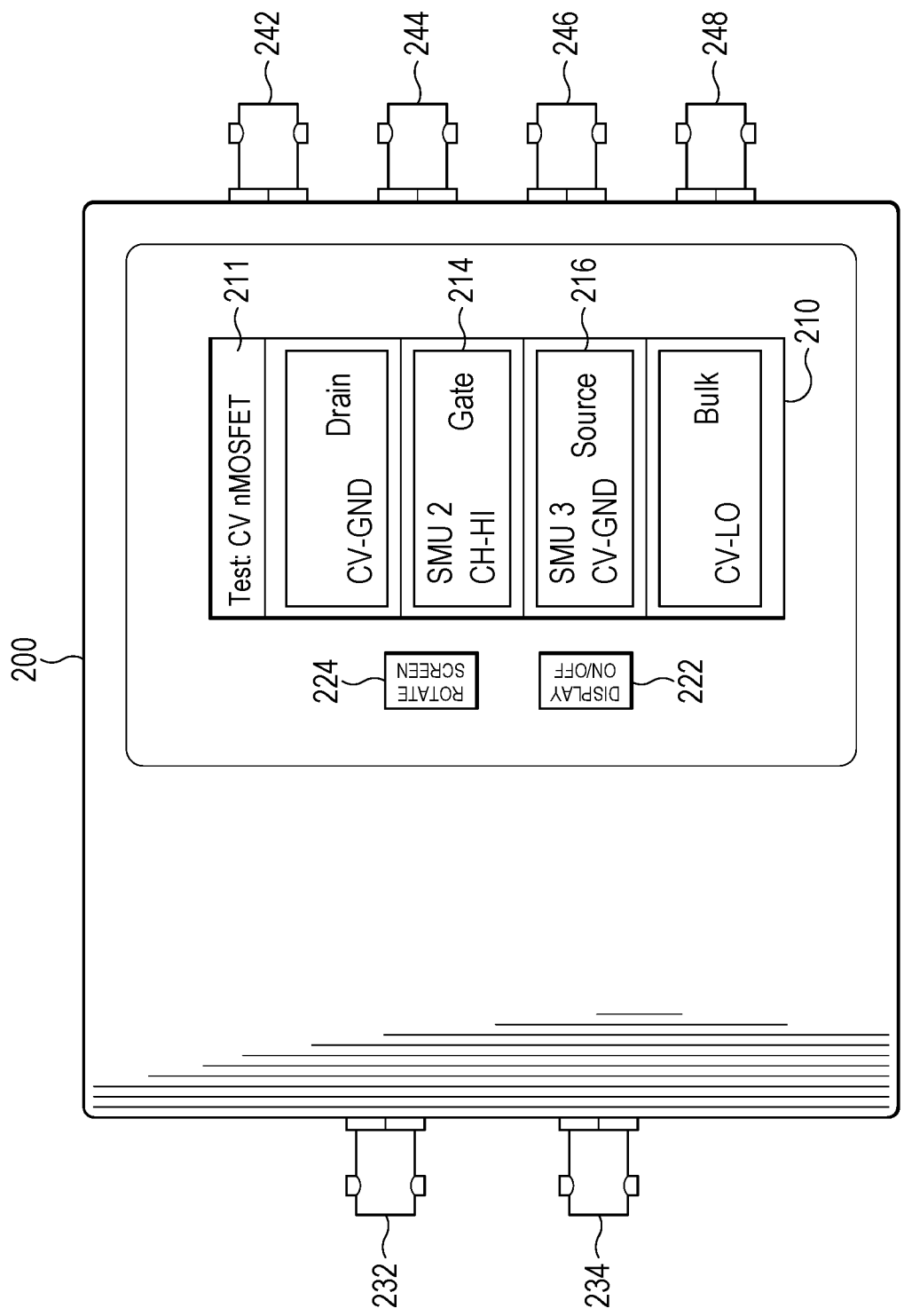
FIG. 2 is a top surface view of a connection interface according to embodiments of the invention.

FIG. 2 shows a top surface view of a specific example embodiment of a dynamically configurable remote instrument connection interface 200. The connection interface 200 has two host-instrument connectors 232, 234 for connecting the connection interface 200 to two separate test and measurement instruments, in this example, two SMUs (not shown). The connection interface 200 has four DUT connectors 242, 244, 246, 248 for connecting the connection interface 200 to a single DUT (not shown). In this example, the connectors 242, 244, 246, 248 are labeled on the side (not shown) of the connection interface 200, respectively as "CH1," "CH2," "CH3," "CH4." In this example, the connection interface 200 is illustrated as being configured to connect to a transistor as the device-under-test.

The connection interface 200 includes a display 210, which in this example, is a color LCD. Regions 211, 214, 216 of the display 210 display useful information to a user about the connections to be made to the connection interface 200. The regions 214, 216 are each visually associated with one of the connectors 242, 244, 246, 248. For example, the region 214 of the display 210 is substantially near, and substantially visually aligned with, the "CH2" connector 244. This visual alignment between the connector 244 and the region 214 of the display 210 indicates to a user that the information displayed in the region 214 relates to the connections to be made to the connector 244. Other techniques can also be used to visually associate the region 214 with the connector 244. For example, the region 214 can have a blue border, and the connector 244 can also be colored blue to reinforce a user's visual association between the region 214 and the DUT connector 244.

The region 214 displays the identifier "Gate" on the side of the display 210 nearest the "CH2" DUT connector 244. This informs a user that she should connect the signal from the "Gate" connection point on her DUT—i.e. the gate terminal of the transistor—to the DUT connector 244 that is visually associated with the region 214. Likewise, the region 216 of the display 210 is visually associated with the "CH3" DUT connector 246, and displays the identifier "Source" on the side of the display 210 nearest the connector 246, thereby instructing a user to connect the signal from the "Source" connection point on her DUT—i.e. the source terminal of the transistor—to the DUT connector 246 that is visually associated with the region 216.

The display regions 214, 216 also display identifiers on the portion of the display 210 closest to the host-instrument connectors 232, 234. The region 214 shows the labels "SMU 2" and "CV-HI," indicating to a user that she is to connect the associated host-instrument connector 232 to the "CV-HI" input of one connected SMU instrument. Likewise, the region 216 shows the labels "SMU 3" and "CV-GND," thereby conveying to a user that she is to connect the associated host-instrument connector 234 to the "CV-GND" input of a second connected SMU instrument.

In addition to showing dynamically configurable identifiers for particular connection points on a DUT and for host instruments and particular connectors on host instruments, in order to aide a user in making appropriate inter-device connections, the display 210 may also display other useful information for a user. For example, in the connection interface 200, the display region 211 shows a name of a particular measurement, or test, to be performed on the DUT, in this case "CV nMOSFET." Such a measurement name provides to a user additional context for the identifiers displayed in other regions of the display 210, such as the regions 214, 216. In addition to measurement names, regions of the display 210 may display information such as the current step of a multi-step test, an instruction to a user to modify a DUT setting, status information related to a connected test and measurement instrument or a connected DUT, or even real-time measurement information.

The connection interface 200 also includes controls 222, 224 that can be actuated by a user. A control circuit (not shown) accepts input from the controls 222, 224 and is structured to modify the information displayed on the display 210. In the example connection interface 200, the controls 222, 224 are implemented as separate push buttons, however, such controls can be implemented in any suitable form, including, for example, as a touchscreen interface overlaid on the display 210. Control 222 operates to toggle the display 210 on or off. Control 224 operates to rotate the contents of the display 210 between portrait and landscape orientations. However, the controls 222, 224 and the control circuit may also be implemented to perform more complex functions, including communicating with and controlling a connected test and measurement instrument. For example, control 222 may be activated by a user to indicate that the user is ready to execute the next step of a multi-step test, and may communicate with a connected test and measurement instrument to change the settings of the connected instrument in preparation for that next step.

Figure 3:
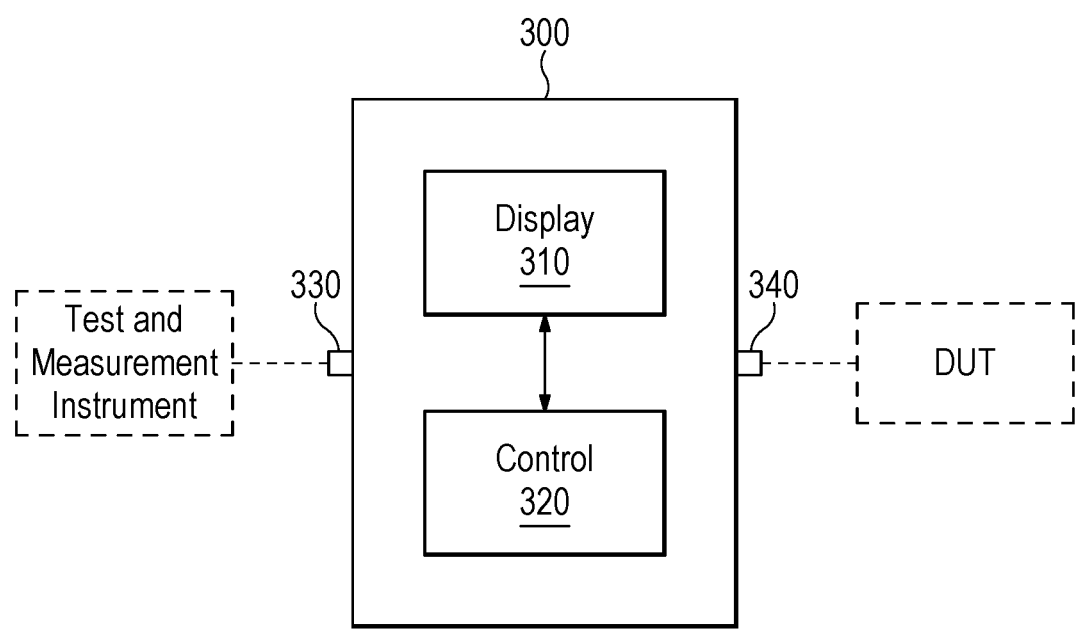
FIG. 3 is a block diagram of a connection interface according to embodiments of the invention.

FIG. 3 shows a block diagram for a dynamically configurable remote instrument connection interface 300 according to some embodiments of the invention. The connection interface 300 includes a single DUT connector 340 for connecting the connection interface 300 to a device under test. In some embodiments, the connector 340 is simply an electrical contact, for example, a probe tip. The connector 340 conveys measured signals from the DUT, through an electrical path (not shown) in the connection interface 300, to the host-instrument connector 330. The connector 330 connects to a single test and measurement instrument. For example, the connector 330 may connect to a channel of an oscilloscope, a sense-force pair for an SMU, or a high-low pair for a DMM or other DC/AC measurement device.

The connection interface 300 includes a display 310, one or more controls (not shown), and a control circuit 320, which perform similar functions, respectively, as the display 110, the controls, and the control circuit 120 of the connection interface 100 discussed above.

Figure 4:
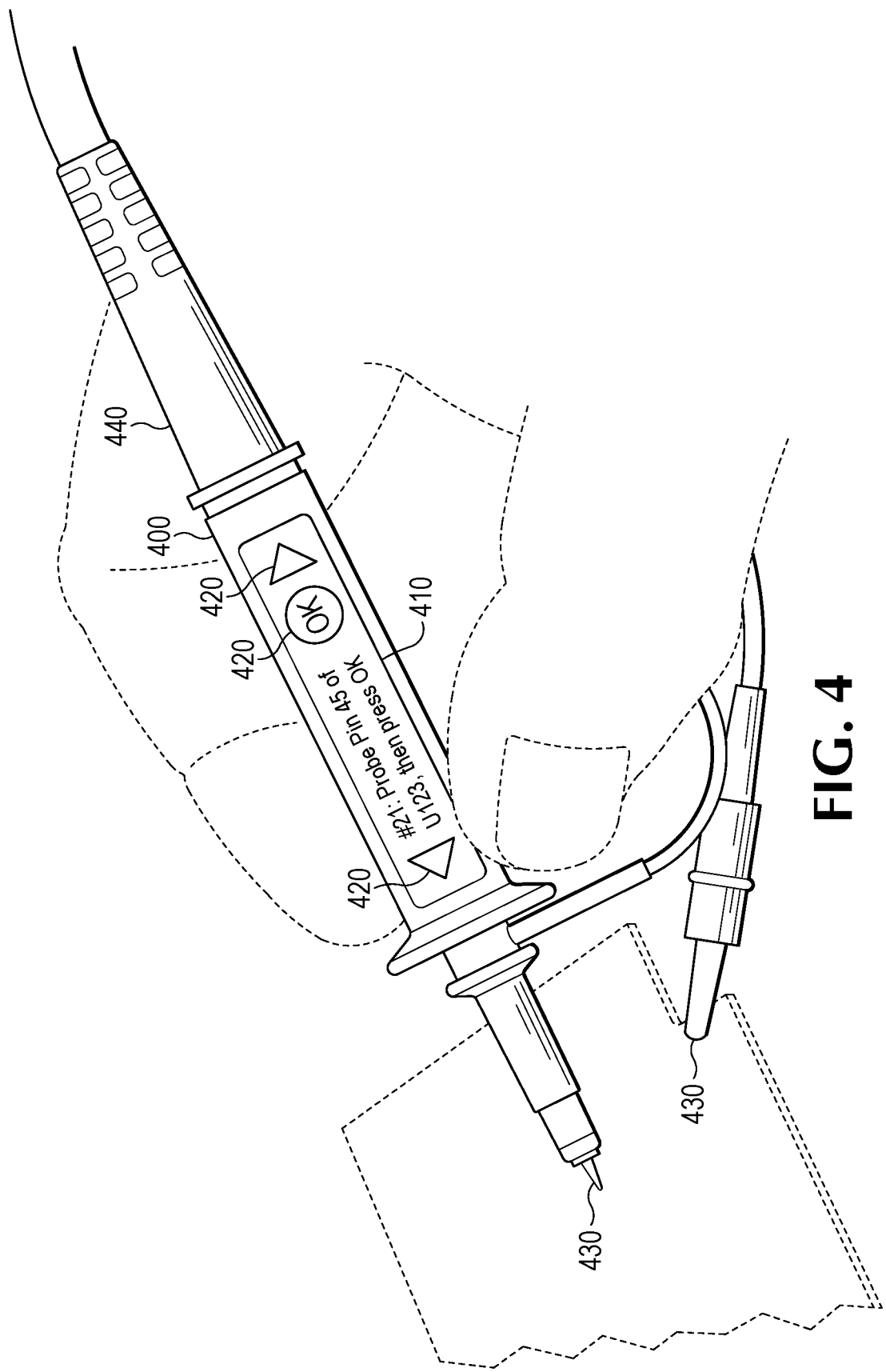
FIG. 4 is a side view of a connection interface according to embodiments of the invention.

FIG. 4 shows a side view of a dynamically configurable remote instrument connection interface 400 according to an exemplary embodiment of the apparatus 300 depicted in FIG. 3. The connection interface 400 includes a DUT connector 430 for making an electrical connection from the connection interface 400 to a test point on the DUT. In the connection interface 400, the DUT connector 430 comprises a probe tip and ground clip pair. The connection interface 400 also includes a host-instrument connector 440, which, in this example, simply comprises a solder connection between the connection interface 400 and a coaxial cable (not shown) that connects to a test and measurement instrument.

The connection interface 400 includes a display 410 which is capable of displaying information relevant to a connection to be made at the DUT connector 430. For example, as depicted in FIG. 4, the display 410 presents an instruction to the user to "Probe Pin 45 of U123, then press OK." By reading such a message, the user knows what particular measurement node on the DUT should be connected to the DUT connector 430.

For an additional level of user interactivity, the connection interface 400 also includes controls 420. As depicted in FIG. 4, the controls 420, comprising an "OK" button and two arrow buttons, are implemented as responsive areas of a touchscreen overlaid on the display 410. The controls 420 may also be implemented as physical buttons, or other suitable control types. A user may activate these controls to manipulate the information displayed on the display 410 and to communicate with the attached test and measurement instrument. For example, a user may touch the "OK" button 420 to confirm that she has probed "Pin 45 of U123" as instructed by the message displayed on the display 410. This activation of control 420 may cause the connection interface 400 to send a command to the connected test and measurement instrument to take a measurement or acquire data and may also cause the display 410 to display a new message or an instruction related to the next step of a test that the user is performing. Thus, the connection interface 400 allows a user to receive instructions and to execute some control over a connected test and measurement instrument at a location close to the DUT.

Although specific embodiments of the invention have been illustrated and described for purposes of illustration, various modifications may be made without departing from the spirit and scope of the invention. Accordingly, the invention should not be limited except as by the appended claims.

What is claimed is:

1. A connection interface between a host test and measurement instrument and a device under test, the connection interface comprising:
   a housing;
   a device-under-test connector on the housing structured to connect to the device under test;
   a host-instrument connector on the housing structured to connect to the host instrument;
   an electrical path within the housing between the device-under-test connector and the host-instrument connector; and
   a display disposed on a surface of the housing, the display having a first region that is visually associated with, by being located in close physical proximity to, the device-under-test connector, in which the first region of the display displays an identifier for a particular connection point on the device under test.

2. The connection interface of claim 1 in which the first region of the display is visually associated with the device-under-test connector by color.

3. The connection interface of claim 1 in which the particular connection point on the device under test is selected from the group consisting of an input connector, an output connector, a terminal, a contact, a test point, a via, and a pin.

4. The connection interface of claim 1 in which the first region of the display is configured to display measurement data from the particular connection point on the device under test.

5. The connection interface of claim 1 in which a second region of the display is configured to display information related to the host instrument.

6. The connection interface of claim 5 in which the second region of the display is configured to display an identifier for the host instrument.

7. The connection interface of claim 5 in which the second region of the display is configured to display an identifier for a particular connection point on the host instrument, the particular connection point on the host instrument selected from the group consisting of an input connector, an output connector, a serial data connector, and a parallel data connector.

8. The connection interface of claim 5 in which the second region of the display is configured to display information about the status of the host instrument.

9. The connection interface of claim 1 in which a second region of the display is configured to display a name for a particular measurement of the device under test.

10. The connection interface of claim 1, further comprising:
   a control for actuation by a user; and
   a control circuit having the control as an input, structured to communicate with the host instrument and to modify the information displayed on the display.

11. The connection interface of claim 10 in which the control is selected from the group consisting of a switch, a button, a knob, a slider, and a touchscreen.

12. The connection interface of claim 10 in which, in response to the user actuating the control, the control circuit communicates to the host instrument a request to initiate a particular measurement of the device under test.

13. The connection interface of claim 10 in which the control circuit modifies the information displayed on the display in response to the user actuating the control.

14. The connection interface of claim 10 in which the control circuit modifies the information displayed on the display in response to a request from the host instrument.

15. The connection interface of claim 1, further comprising:
   a plurality of device-under-test connectors on the housing, each device-under-test-connector structured to connect to one of a plurality of devices under test;
   a plurality of instrument connectors on the housing, each instrument connector structured to connect to one of a plurality of test and measurement instruments; and
   a plurality of configurable electrical paths within the housing between the plurality of device-under-test connectors and the plurality of instrument connectors, in which the plurality of electrical paths are configured in response to a request from the host instrument.

16. A test and measurement system comprising:
   a test and measurement instrument; and
   a connection interface between the instrument and at least one device under test, the connection interface disposed in a separate housing from the instrument, in which the connection interface comprises:
      an instrument connector on the housing, connected by a cable to a connector on the instrument;
      a device-under-test connector on the housing structured to be connectable to the device under test;
      an electrical path within the housing between the instrument connector and the device-under-test connector; and
      a display disposed on a surface of the housing, the display having a first region visually associated with, by being located in close physical proximity to, the device-under-test connector and the first region displaying an identifier for a particular connection point on the device under test.

17. The system of claim 16 in which the instrument communicates with the connection interface to control the information displayed on the display of the connection interface.

18. The system of claim 16, further comprising:
   a plurality of test and measurement instruments;
   in which the connection interface further comprises:
      a plurality of instrument connectors on the housing that are connected by a respective plurality of cables to a respective plurality of connectors on the plurality of instruments;
      a plurality of device-under-test connectors on the housing that are structured to be connectable to a respective plurality of particular connection points on the at least one device under test;
      a signal routing circuit within the housing providing a set of configurable electrical paths between the plurality of instrument connectors and the plurality of device-under-test connectors; and
      a plurality of regions of the display, each region visually associated with one of the plurality of device-under-test connectors and configured to display an identifier for the respective particular connection point on the at least one device under test.

19. A method of instructing a test and measurement instrument user to make a connection between a particular connector on a test and measurement instrument and a particular point on a device under test, the method comprising:
   displaying, on a first portion of a display, an identifier for the particular point on the device under test, the first portion of the display being located in close physical proximity to a first connector on a connection interface between the test and measurement instrument and the device under test; and displaying, on a second portion of the display, an identifier for the particular connector on the test and measurement instrument, the second portion being located in close physical proximity to a second connector on the connection interface between the test and measurement instrument and the device under test.

\* \* \* \* \*